United States Patent
Elo et al.

(10) Patent No.: US 6,839,232 B2
(45) Date of Patent: Jan. 4, 2005

(54) FAN-LESS HOUSING

(75) Inventors: Anders Elo, Södertälje (SE); Jörgen Eriksson, Stockholm (SE); Niclas Sonesson, Stockholm (SE)

(73) Assignee: PacketFront Sweden AB, Hagersten (SE)

( * ) Notice: Subject to any disclaimer, the term of this patent is extended or adjusted under 35 U.S.C. 154(b) by 54 days.

(21) Appl. No.: 10/385,210

(22) Filed: Mar. 10, 2003

(65) Prior Publication Data

US 2004/0095720 A1 May 20, 2004

(30) Foreign Application Priority Data

Nov. 14, 2002 (SE) .............................................. 0203370

(51) Int. Cl.[7] .............................................. H05K 7/20
(52) U.S. Cl. ...................... 361/690; 165/80.3; 165/185; 257/722; 361/703; 361/704; 361/702; 361/715; 361/710; 361/688
(58) Field of Search .............................. 165/80.2, 80.3, 165/185; 257/722; 361/688–695, 702–710, 715, 728–730, 752, 758

(56) References Cited

U.S. PATENT DOCUMENTS

| | | | | |
|---|---|---|---|---|
| 5,109,318 A | * | 4/1992 | Funari et al. | 361/710 |
| 5,461,542 A | * | 10/1995 | Kosak et al. | 361/710 |
| 5,473,511 A | * | 12/1995 | Reddy et al. | 361/719 |
| 5,812,372 A | * | 9/1998 | Galyon et al. | 361/699 |
| 6,175,501 B1 | * | 1/2001 | Bortolini et al. | 361/720 |
| 6,680,849 B2 | * | 1/2004 | Atkinson et al. | 361/719 |

* cited by examiner

*Primary Examiner*—Gregory Thompson
(74) *Attorney, Agent, or Firm*—Ware, Fressola, Van der Sluys & Adolphson LLP

(57) ABSTRACT

In a heat dissipating internally fan-less housing (20) for electronic circuits and components (28), the housing has an assembly of two container (10) parts comprising heat-sink fins (12). Each part has a substantially diagonal (14) shaped profile. In the housing, a circuit-board (29) is mounted along the diagonal (14) profile thus providing that the long-side ends of the circuit-board (29) on each side of the board are covered by a greater mass of heat-sink fins (12) compared to a horizontally mounted circuit board for a better cooling of components.

8 Claims, 3 Drawing Sheets

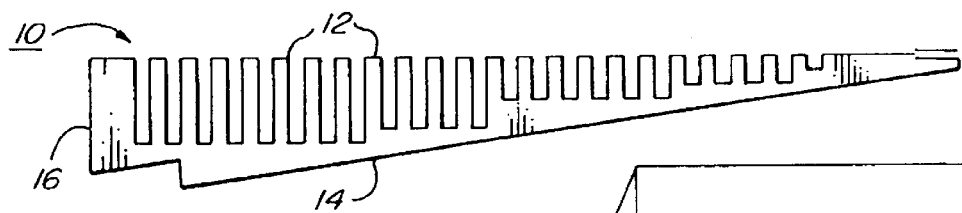
FIG. 1a
FIG. 1b
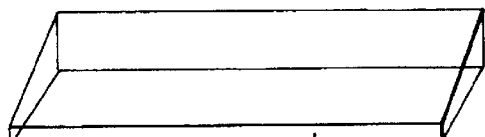
FIG. 2a
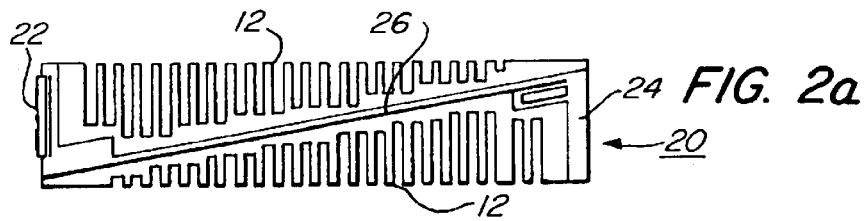
FIG. 2b
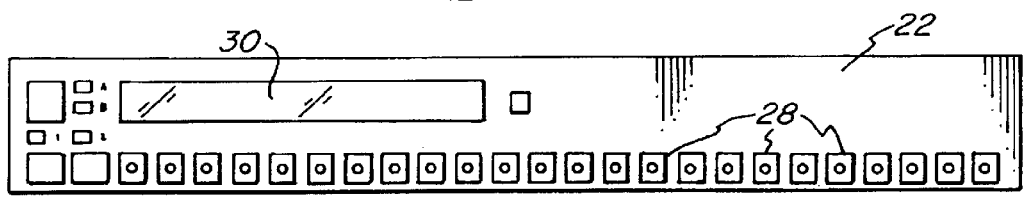
FIG. 2c

FAN-LESS HOUSING

BACKGROUND OF THE INVENTION

1. Technical Field

The present invention pertains to a heat dissipating internally fan-less housing for electronic circuits and components.

2. Description of the Background Art

Current housings for electronic components are in excess of heat-sink fins provided with an internal fan for cooling of electronic components. A fan inside the housing imposes limitations to the dimension of the housing and how electronic components for instance on a printed circuit board (PCB) should be mounted to accomplish best possible heat dissipating features. Fans provide a disadvantage in having a mechanical cooling mechanism with moving parts thus having a much shorter life length than a heat sink passive cooling mechanism.

A limitation imposed to a housing for the intended purpose of being utilized for instance for routers and switches in a broadband network is set by a standard for mounting in a rack or cabinet. This standard stipulates a 19 inch (48.26 cm) wide housing, a height or vertical space of one rack unit (1U), 1.75 inches (4.45 cm) and a maximum depth of 30 cm. The standard thus sets out limitations making it hard to mount fans outside and on top of a housing.

Another limitation for such a housing is set out by the possibility to mount status indicators and console ports on a front panel of the housing. Present techniques admit a one row mounting of for instance indicator LEDs on the front panel. If a plurality of rows of LEDs or other interfaces are to be mounted this could be accomplished by providing them on a rear panel. Such a mounting is undesirable, because it is favorable to be able to actually see all status indicators on the front panel for maintenance, status reading purposes or other. Numerous by hand chassis mounted LEDs are expensive compared to for instance LCD displays, but such displays require more space for mounting on a front panel than is currently available.

In current technology a possible technique for achieving a front panel mounting with a plurality of rows of indicators comprises, for example, to put a main PCB board as far to the bottom of the housing as possible and to additionally connect smaller/daughter PCB cards above the main board and mounting those to the front panel and connecting the smaller boards to the main board via cabling. A cabled connection is vulnerable to come loose and imposes additional manufacturing costs. Another disadvantage for a cabled connection between two boards is directed to molding of parts, especially if the additional board is mounted on the front panel, for example, molding of circuit boards in a heat dissipating substance such as silicone compounds with different elasticity could impose stress on cable connections. Using a daughter PCB card for additional interfaces or LED indicators forces a main board to be mounted in the bottom of the housing. When using heat sinks for cooling this would not provide enough cooling on the bottom of the housing since there is little or no space left for heat sink fins.

One other obvious reason for not having status indicators on a rear panel is that a rack or cabinet is often placed close to a wall with the rear panels facing the wall, or if not placed in this manner the rack is covered by a housing of screw attached or riveted metal sheets on the rear of the rack. The housing thus aims to protect rack-mounted equipment from dust, humidity, dirt etc. Hence, present rack mounted equipment is maintained or changed by pulling it out from its rack position and replacing it with new or maintained equipment.

Also, to overcome manufacturing costs, it would be appreciated that one and the same tool can be used for pressing the top and bottom parts of a housing and still fulfill the 19 inches, 1U rack standard.

SUMMARY OF THE INVENTION

The present invention aims to provide a solution to the above mentioned and other problems in relation to rack-mounted equipment. For this purpose the invention sets forth a heat dissipating internally fan-less housing for electronic circuits and components. The housing comprises an assembly of two container parts comprising heat-sink fins each part having a substantially diagonal shaped profile. These parts are assembled to form the greater part of the housing as being substantially box shaped by positioning the diagonal profiles to form the box shape. In the housing is mounted a circuit-board along the diagonal profile thus providing that the long-side ends of the circuit-board on each side of the board are covered by a greater mass of heat-sink fins for a better cooling of components compared to a horizontally mounted circuit board.

In one embodiment of the present invention the container parts that form the housing are spaced apart through spacing/distance pieces, and the pieces are designed to be able to penetrate through apertures made in the circuit board.

Another embodiment comprises that the apertures have at least fitting allowance to the spacing pieces. A further embodiment comprises that the housing is filled with a heat dissipating elastic substance. This embodiment provides that the circuit board is laying floating in the heat dissipating substance substantially free from touching the housing. The circuit board thus in addition to heat dissipation being protected against damage imposed to the housing.

A still further embodiment comprises that the mounting of the circuit board in addition to a better cooling enables the mounting of multiple indicators and/or at least one display on long-side panels attached to the housing.

Yet a further embodiment provides that the housing dimension is adapted within stipulated standard rack measures for a 19-inch, 1U rack.

A further embodiment provides that fastening means enable the mounting of the housing in a vertical position in a rack, thus taking advantage of the chimney effect for heat dissipation.

Yet another embodiment provides that one long side of the housing is made shorter then the stipulated standard of 48.26 cm to fit at least one fan, and thereafter equipped with a smaller housing at one short side in order to fill a 19-inch rack standard.

BRIEF DESCRIPTION OF DRAWINGS

Henceforth reference is had to the description and its accompanying drawings for a better understanding of the present invention with its given examples and embodiments, wherein:

FIGS. 1a and 1b are schematically illustrating a side elevation view of a bottom or top container for a housing, and a schematic perspective view of a diagonal profile for a container in accordance with the present invention, respectively;

FIGS. 2a, 2b and 2c are illustrating side elevation view, front elevation view and a bottom or top elevation view of an assembled box shaped housing in accordance with the present invention;

DETAILED DESCRIPTION OF PREFERRED EMBODIMENTS

Figure 3:
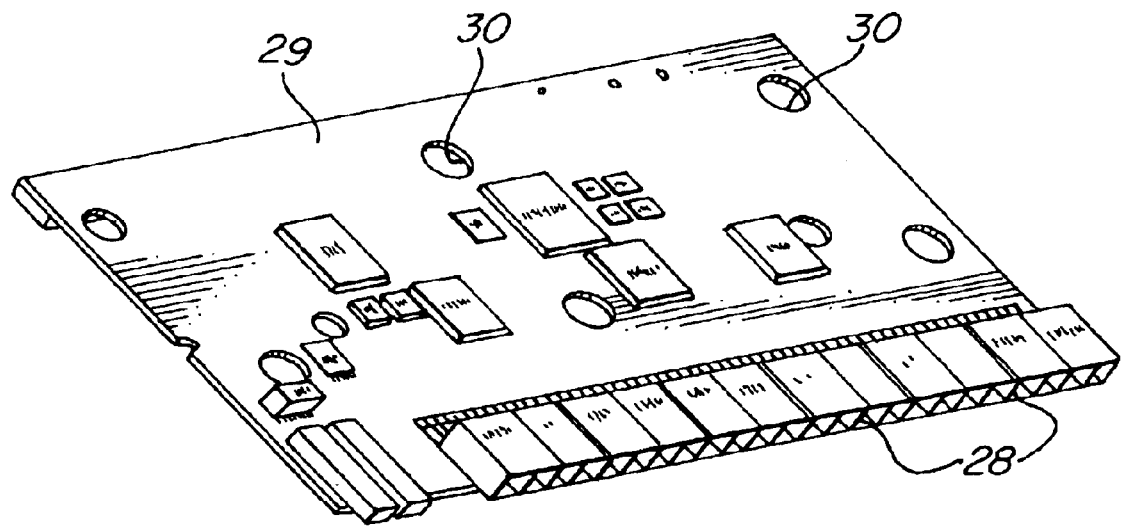
FIG. 3 is illustrating a circuit board with electronic components and apertures for spacing pieces in accordance with the present invention.

The present invention provides a housing/casing for electronic components, especially for a router or switch in a broadband network. The housing is provided heat-sink fins but no internal fan for cooling of the electronic components.

Moreover, the housing fulfills the standard set out for a rack/cabinet mounting, which stipulates a 19 inch (48.26 cm) wide housing, and the height or vertical space of one rack unit, 1.75 inches (4.45 cm). It also provides the possibility to mount status indicators, displays, connectors, other interfaces etc. on its front panel in excess of what is currently achievable.

Furthermore, the present invention in one embodiment provides one and the same tool for pressing a top and bottom container of the housing fulfilling the 19 inches, 1U rack standard.

FIG. 1a is schematically illustrating a side elevation view, the short side elevation, of a bottom or top container 10 for a housing in accordance with the present invention. The container 10 is provided with heat-sink fins 12, and a diagonal profile 14, i.e., the profile of a box if it is cut through along its short side diagonal from one long side to the other as schematically depicted in FIG. 1b. A container with a heat-sink fin 12 pattern could be manufactured by pressing aluminum in a tool. As is depicted in FIGS. 1a–1b and FIGS. 2a–2c, with two containers 10 it is possible to assemble a box shaped housing 20 by positioning the diagonal profiles 14 to form the box shape. Two panels, one front panel 22 and a rear panel 24, are utilized to accomplish the assembly of the box shaped housing 20.

In FIG. 1a, it can be seen that the heat-sink fin 12 part close to the highest 16 elevation of the container 10 has a greater mass, which provides an enhanced cooling effect to electronic components mounted adjacent to those fins.

FIGS. 2a, 2b and 2c are schematically illustrating an assembled box shaped housing in accordance with the present invention through a side elevation view (in FIG. 2a), a front elevation view (in FIG. 2b), and a bottom or top elevation view (in FIG. 2c).

Depicted in FIG. 2a is a solid line 26 schematically showing how a circuit board (FIG. 3) is diagonally mounted inside the housing 20. Conventionally a circuit board is mounted horizontally with electronic components 28 protruding upwards providing an even distribution of heat-sink fins over the circuit board 29. By employing the present invention, electronic components 28 placed on the circuit board adjacent to the front panel 22 benefit from a greater mass of heat-sink fins 12 which provides a better cooling effect to those components 28. Heat intensive electronic components, such as FE ports/transceivers (FE; Fast Ethernet) in a router, are mounted adjacent to the front panel to have their indicators, connections and/or other known interfaces abutting, being flush to or protruding out off the front panel 22. Further heat conductivity between the board 29 and the fins 12 can be established by applying for instance Bromancob GAP Pad material.

As mentioned, the utilization of a daughter PCB card for additional interfaces or LED indicators forces the mounting of a main board 29 to the bottom of the housing. When using heat sinks for cooling this would not provide enough cooling on the bottom of the housing 20 as there is limited space left for heat sink fins 12. To obtain enough cooling area on both the top and bottom side of the housing, the inventive idea provided through one embodiment of the present invention is to place the circuit board 29 diagonally in the housing, thus providing enough heat sink cooling area on both sides of the housing.

The front panel 22 in FIG. 2b is schematically depicted as equipped with FE ports/and transceivers. Additionally depicted in FIG. 2 is a LCD display 30 replacing status indication through LED:S. Conventional routers/switches equipped with a horizontal placed PCB cannot provide an LCD display on the front panel 22 and at the same moment fulfill the 1U rack height of 4.45 cm, for example, due to lack of space taken by the horizontal placed PCB with its mounted electronic components.

Figure 4:
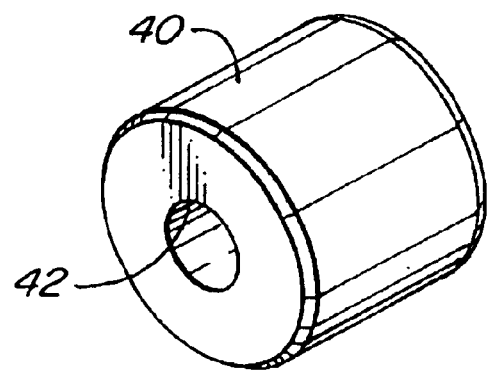
FIG. 4 is illustrating a spacing piece in accordance with the present invention.

FIG. 3 illustrates a circuit board 29 utilized for a router/switch in accordance with the present invention. The board is provided with apertures 30 in which spacing/distance pieces 40 (FIG. 4) are to be housed. These spacing pieces 40 are abutting the two diagonally profiled containers 10 and fastened by screws, bolts or other suitable fastening means by utilizing through holes 42 in the spacing pieces 40. The apertures 30 in the circuit board 29 are bigger than the diameter of the spacing pieces 40 with at least a fitting distance so that the pieces 40 are not holding the circuit board 29 in its place when the housing 20 is assembled.

Figure 5:
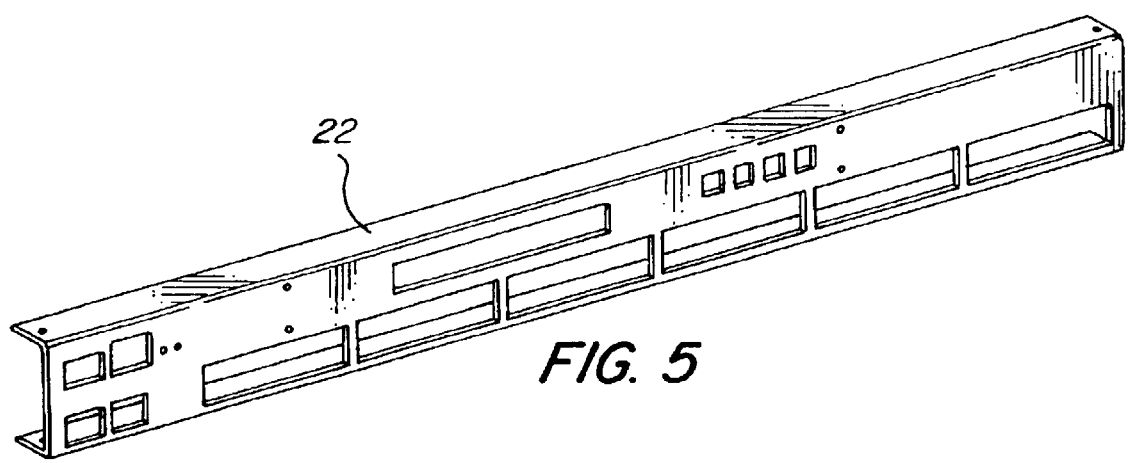
FIG. 5 is illustrating a front panel to the housing in accordance with the present invention.

To further enhance the heat dissipating features of the present invention all voids in the housing 20 are filled with a heat dissipating substance such as silicone used for this purpose. When the housing is filled with the heat dissipating substance, the circuit board so to speak "floats" in the substance inside of the housing 20 due to not being fastened directly to the containers 10 making up the housing 20. Hence, the circuit board 29 is substantially free from touching the housing, and the circuit board thus in addition to heat dissipation being protected when the housing itself should be damaged. FIG. 5 is depicting a front panel 22 to be attached to the housing 20 in accordance with the present invention with its apertures for FE ports/transceivers, display 30, connectors, indicators, other interfaces etc.

Figure 6:
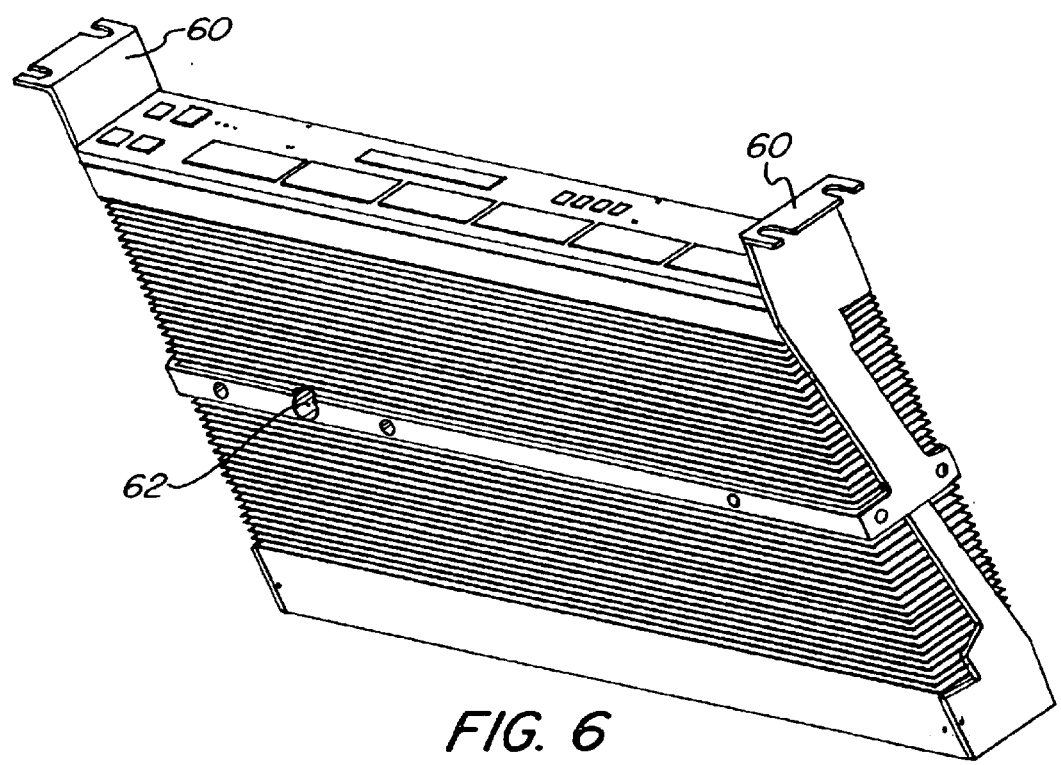
FIG. 6 is illustrating a housing in accordance with the present invention for mounting in a rack.

FIG. 6 is illustrating a housing 20 fully equipped for mounting in a rack or cabinet in accordance with the present invention. The housing 20 has attached to it fastening means 60 for attachment in a rack. Furthermore, the housing is equipped with an aperture 62, which is utilized for injection of a heat dissipating substance to fill out the voids inside the housing, and thus establishing the floating circuit board 29. With the fastening means 60 it is possible to mount the housing 20 in a vertical position in a rack, thus taking advantage of the so called chimney effect as heated air dissipates upwards. If housings 20 in a rack were mounted horizontal, the heated air would so to speak get "stuck" between stacked housings.

In one embodiment of the present invention, it is provided that a fan can be mounted on one short side of the housing. The fans are then so attached that they convey airflow along the fins 12, when desirable the airflow can be provided along the fins 12 both on the top and bottom containers 10. To achieve this, one long side of the housing 20 is made shorter than the stipulated standard 48.26 cm (19 inches) with a suitable shortening such as for instance 1.3 cm shorter to fit at least one fan. In one embodiment the housing is assembled with a shorter long side, and thereafter equipped with a smaller housing at one short side in order to fulfil the 19-inch rack standard. When called upon, this smaller housing is able to house fans. In this manner the housing 20 is made very versatile an adaptable to different environmental conditions.

The present invention has been described through given examples and embodiments, but not intended to be limited to those. It is believed that the attached set of claims teaches other embodiments obvious for a person skilled in the art.

What is claimed is:

1. A heat dissipating internally fan-less housing for electronic circuits and components comprising:
   (a) two container parts with heat-sink fins, each part having a substantially diagonal shaped profile surface, said diagonal profile surfaces of said parts positioned so that at least a part of said housing is substantially box shaped; and
   (b) a circuit-board mounted along the diagonal profile surfaces thus providing long-side ends of the circuit-board on each side of the board with a greater mass of heat-sink fins as compared to a horizontally mounted circuit board for a better cooling of components.

2. A housing according to claim 1, wherein said container parts forming said housing are spaced apart through spacing pieces, and said pieces are penetrating through apertures in the circuit board.

3. A housing according to claim 2, wherein said apertures having at least fitting allowance to said spacing pieces, and said housing is filled with a heat dissipating elastic substance, whereby said circuit-board is in said heat dissipating substance substantially free from touching the housing and said circuit-board experiences heat dissipation through the housing but is protected against damage imposed on the housing.

4. A housing according to claim 1, further including additional components mounted on at least one long-side panel attached to the housing.

5. A housing according to claim 4, wherein the additional components are chosen from the group consisting of indicators, interfaces and displays.

6. A housing according to claim 1, wherein the housing is dimensionally sized to fit within a standard 19 inch rack.

7. A housing according to claim 1, further including fastening means provided to mount the housing in a vertical position in a rack, thus taking advantage of chimney effect heat dissipation.

8. A housing according to claim 1, wherein one long side of the housing is made shorter than 48.26 cm to fit at least one fan, and thereafter equipped with a smaller housing at one short side in order to fulfill a 19-inch rack standard.

\* \* \* \* \*